(12) United States Patent
Too et al.

(10) Patent No.: US 6,936,501 B1
(45) Date of Patent: Aug. 30, 2005

(54) SEMICONDUCTOR COMPONENT AND METHOD OF MANUFACTURE

(75) Inventors: Seah Sun Too, San Jose, CA (US); James Hayward, Santa Clara, CA (US); Janet D. Kirkland, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/818,981

(22) Filed: Apr. 5, 2004

(51) Int. Cl.[7] ............................................. H01L 23/12
(52) U.S. Cl. ...................... 438/122; 438/106; 257/704; 257/706; 257/713; 257/724
(58) Field of Search ................................ 438/122, 106; 257/704, 706, 713, 724

(56) References Cited

U.S. PATENT DOCUMENTS

| | | | | |
|---|---|---|---|---|
| 5,723,904 A | * | 3/1998 | Shiga | ......................... 257/698 |
| 5,907,474 A | | 5/1999 | Dolbear | |
| 5,926,371 A | | 7/1999 | Dolbear | |
| 6,392,143 B1 | * | 5/2002 | Koshio | ....................... 174/52.4 |
| 6,392,145 B1 | | 5/2002 | Andric | |
| 6,504,243 B1 | | 1/2003 | Andric et al. | |
| 6,558,977 B2 | * | 5/2003 | Nakaoka et al. | ............. 438/107 |
| 2004/0099958 A1 | * | 5/2004 | Schildgen et al. | ........... 257/778 |

* cited by examiner

Primary Examiner—Jasmine Clark
(74) Attorney, Agent, or Firm—Rennie Wm. Dover; Paul Drake

(57) ABSTRACT

A semiconductor component having a lid for protecting a semiconductor chip and a method for manufacturing the semiconductor component. The semiconductor chip has an active surface and a mounting surface. It is flip-chip mounted to a support substrate so the active surface is adjacent the support substrate. A passive or active circuit element may be mounted to the support substrate. The mounting surface of the semiconductor chip has a radius of curvature. A thermal interface material is dispensed on the mounting surface of the semiconductor chip. A lid is coupled to the support substrate via a lid adhesive. A portion of the lid has a radius of curvature that corresponds to the radius of curvature of the semiconductor chip. A force is applied to the lid so that it contacts the thermal interface material and urges the interface material to the sides of the semiconductor chip. The force causes wetting of the thermal interface material.

20 Claims, 1 Drawing Sheet

SEMICONDUCTOR COMPONENT AND METHOD OF MANUFACTURE

FIELD OF THE INVENTION

This invention relates, in general, to a semiconductor component and, more particularly, to heat dissipation from the semiconductor component.

BACKGROUND OF THE INVENTION

The steps involved in manufacturing semiconductor components are typically divided into two broad categories: front-end processing steps and back-end processing steps. Front-end processing steps include photolithography, etching, doping, and passivation, whereas back-end processing steps include chip separation (i.e., dicing), chip mounting, and encapsulation. Encapsulation is an important step because it provides a means of protecting a semiconductor chip from mechanical and environmental stresses. A technique for encapsulating a semiconductor chip is to mount it to a support substrate in a flip-chip orientation and cover it with a lid. The lid has a lip for coupling to the support substrate. The lid is placed over the semiconductor chip such that the lip contacts an adhesive material disposed on the support substrate. The combination of the support substrate, semiconductor chip, and lid form a semiconductor assembly. A force is applied to the lid and the semiconductor assembly is placed in an oven to cure the lid adhesive material.

A drawback with this technique is that there is a mismatch between the radius of curvature of a semiconductor chip mounted to a support substrate and the radius of curvature of the lid. The difference between the coefficient of thermal expansion of the support substrate and the semiconductor chip causes the chip to warp at room temperature. A warped semiconductor chip has a larger radius of curvature than a non-warped semiconductor chip. The larger radius of curvature inhibits wetting of the thermal interface material near the center of the semiconductor chip. The lack of wetting decreases the amount of heat transferred from the semiconductor chip to the lid, which degrades the performance of the semiconductor component.

Accordingly, what is needed is a semiconductor component and a method for improving wetting of a thermal interface material in a semiconductor component thereby enhancing heat dissipation properties of the semiconductor component.

SUMMARY OF THE INVENTION

The present invention satisfies the foregoing need by providing a semiconductor component comprising a semiconductor chip mounted to a substrate and protected by a lid and a method for manufacturing the semiconductor component. The semiconductor chip has a radius of curvature that matches the radius of curvature of the lid. Matching the radii of curvature increases the wetting of a thermal interface material between the semiconductor chip and the lid, which improves heat dissipation from the semiconductor chip. In accordance with one aspect, the present invention comprises providing a support substrate having a major surface and a semiconductor chip having first and second surfaces. The first surface has a first radius of curvature and is coupled to second surface of the semiconductor chip. A lid having a chip-mating surface is coupled to the support substrate. The chip-mating surface has a second radius of curvature, wherein the first radius of curvature matches the second radius of curvature.

In accordance with another aspect, the present invention includes a method for manufacturing a semiconductor component comprising providing a support substrate having a semiconductor die mounted thereto, wherein the semiconductor die has a die surface which has a first radius of curvature. A lid having a lip and first and second surfaces is coupled to the support substrate, wherein a portion of the first surface has a second radius of curvature. Coupling the lid to the support substrate includes selecting the lid so the second radius of curvature matches the first radius of curvature.

In accordance with yet another aspect, the present invention includes a semiconductor component comprising a support substrate having a surface, which has a radius of curvature. A semiconductor chip having first and second surfaces is mounted to the support substrate. The surface of the semiconductor chip has a radius of curvature corresponding to the radius of curvature of the support substrate surface. A lid having a lip and a mating surface is mounted to the support substrate. The mating surface of the lid has a radius of curvature and is positioned to be adjacent the first surface of the semiconductor chip.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Generally, the present invention provides a semiconductor component comprising a semiconductor chip or die protected by a lid or cap, where the radius of curvature of the semiconductor chip corresponds to the radius of curvature of a portion of the lid. In accordance with an embodiment of the present invention, the semiconductor chip is flip-chip mounted to a support substrate comprising an organic material having a coefficient of thermal expansion that is different from that of the semiconductor chip at room temperature. The support substrate is also referred to as a support structure. Optionally, an underfill material is between the semiconductor chip and the support substrate. The underfill material may have a different coefficient of thermal expansion than the semiconductor chip and the organic material of the support substrate. This mismatch warps the semiconductor chip. A thermal interface material is disposed on the semiconductor chip and a lid having a mating surface and a lip is mounted over the semiconductor chip. The radius of curvature of the mating surface is selected to correspond to that of the semiconductor chip.

Because the radii of curvature of the semiconductor chip and the mating surface of the lid correspond to each other, a clamping force applied to the lid produces a uniform pressure on the thermal interface material. The pressure is sufficient to cause wetting of the thermal interface material. Wetting lowers the thermal resistance between the semiconductor chip and the lid, thereby improving heat removal from the semiconductor chip.

Figure 1:
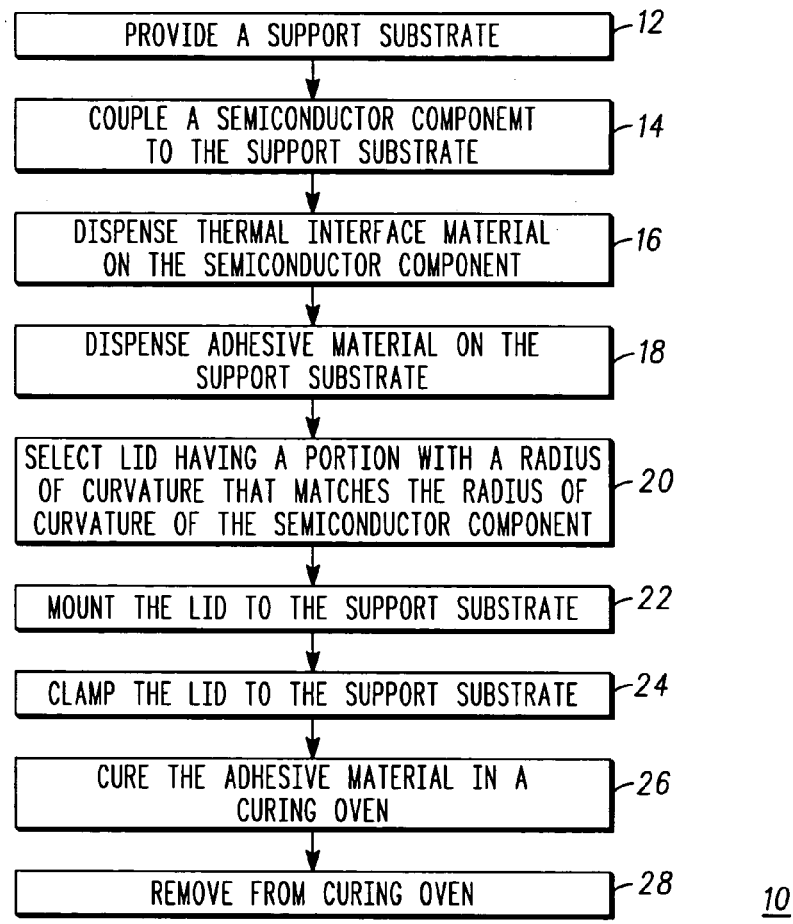
FIG. 1 is a flow diagram for manufacturing a semiconductor component in accordance with an embodiment of the present invention.

FIG. 1 is a flow diagram 10 of a method for manufacturing a semiconductor component in accordance with an embodiment of the present invention. In a step indicated by box 12, a support substrate is provided. Preferably, the support substrate is an organic material. Alternatively, the support substrate is a ceramic material. In a step indicated by box 14, a semiconductor chip is mounted to the support substrate in a flip-chip orientation and an underfill material is placed between the semiconductor chip and the support substrate. The semiconductor chip, the underfill material, and the support substrate have different coefficients of thermal expansion which causes the radius of curvature of the semiconductor chip to increase when the underfill material cures. Thus, the semiconductor chip mounted to the support substrate warps at room temperature. In a step indicated by box 16, a thermal interface material is dispensed on the semiconductor chip. Suitable dispense techniques include using a syringe to dispense the thermal interface material or stencil printing the thermal interface material. The method for dispensing the thermal interface material is not a limitation of the present invention. In a step indicated by box 18, an adhesive is dispensed onto the support substrate. In a step indicated by box 20, a lid having a mating surface and a lip is selected. The radius of curvature of the portion of the lid that mates with the semiconductor chip, i.e., the mating surface, corresponds to the radius of curvature of the semiconductor chip. The mating surface of the semiconductor chip refers to the radius of curvature of the back or mounting surface of the semiconductor chip. Preferably, the radii of curvature of the portion of the lid and the semiconductor chip are within twenty percent of each other. More preferably, the radii of curvature of the chip and the lid are within five percent of each other. Even more preferably, the radii of curvature of the chip and the lid are the same, i.e., they match.

In a step indicated by box 22, lid attach material is formed on the lip of the lid and the lid is mounted to the support substrate. In a step indicated by box 24, the lid is clamped to the support substrate. Clamping the lid to the support substrate applies a predetermined force on the lid. The combination of the support substrate, the semiconductor chip, the lid, and the clamp is referred to as component assembly. In a step indicated by box 26, the component assembly is cured in an oven at a temperature ranging from about 100 degrees Celsius (° C.) to about 180° C. for a period ranging from about 60 seconds to about 120 minutes. After curing, the component assembly is removed from the curing oven (a step identified by box 28), the clamp is removed, and the semiconductor component is ready for electrical evaluation or release as finished product.

Figure 2:
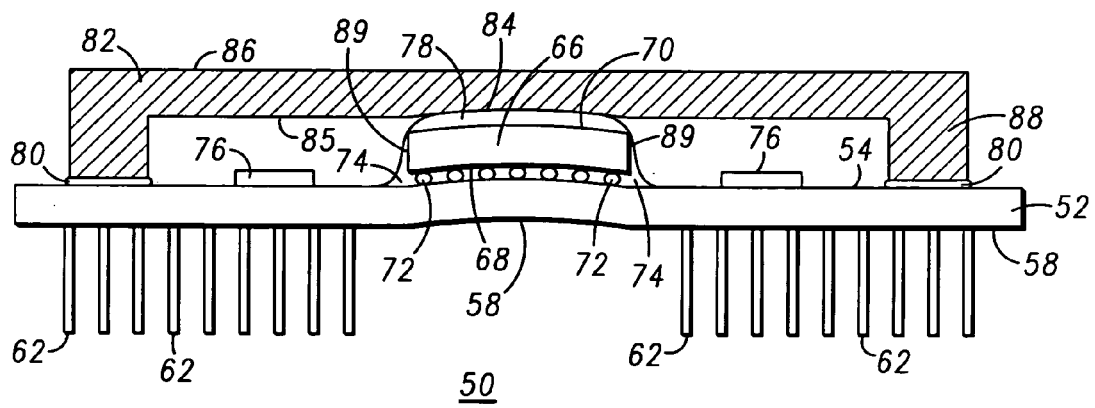
FIG. 2 is cross-sectional side view of a semiconductor component in accordance with the embodiment of FIG. 1.

FIG. 2 is a cross-sectional side view of a semiconductor component 50 during manufacture in accordance with an embodiment of the present invention. Semiconductor component 50 comprises a Pin Grid Array (PGA) substrate 52 having a top or mounting surface 54 to which a semiconductor chip 66 is flip-chip mounted. Preferably, PGA substrate 52 comprises an organic material. PGA substrate 52 has a bottom or connecting surface 58, which is opposite top surface 54. A plurality of bond pads (not shown) are formed on a portion of top surface 54. This portion is referred to as a semiconductor chip receiving area. A plurality of connector pins 62 extend from bottom surface 58. As those skilled in the art are aware, the bond pads are electrically coupled to corresponding connector pins 62 by metal interconnects (not shown) that extend through PGA substrate 52. It should be understood that substrate 52 is not limited to being a PGA substrate but may also be a Land Grid Array (LGA) substrate, a Ball Grid Array (BGA) substrate, a printed circuit board, or the like.

Semiconductor chip 66 has a front or active surface 68 and a back or mounting surface 70. A plurality of solder bumps 72 are bonded to corresponding under bump metallization (not shown) formed on front surface 68. Techniques for solder bumping to the corresponding under bump metallization are known to those skilled in the art. Semiconductor chip 66 is flip-chip mounted to PGA substrate 52 by bonding solder bumps 72 to corresponding bond pads (not shown) that are disposed on top surface 54. After bonding, an underfill material 74 is dispensed between semiconductor chip 66 and PGA substrate 52.

Circuit elements 76 are mounted to top surface 54 of PGA substrate 52. Circuit elements 76 may be passive elements such as, for example, capacitors, resistors, or inductors, active elements such as, for example, diodes, transistors, etc., or a combination passive and active elements.

A thermal interface material 78 is disposed on a portion of back surface 70. Thermal interface material 78 is thermally conductive. Techniques for disposing or dispensing thermally conductive material 78 are known to those skilled in the art. Thermal interface material 78 helps to compensate for the surface warpage across back surface 70 of semiconductor chip 66. Preferably, thermal interface material 78 is a thermally conductive material such as, for example, a thermal grease, a thermal phase change material, or a thermal gel. More preferably, thermal interface material 78 contains low melting metal fillers or low melting alloy fillers such as, for example, indium, gallium, tin, bismuth, or alloys of these metals.

A lid adhesive material 80 is dispensed on major surface 54. A lid 82 having an inner surface comprising a mating portion 84 and a non-mating portion 85, an outer or external surface 86, and a lip 88 is positioned in lid adhesive material 80 thereby bonding lid 82 to PGA substrate 52. Typically mating portion 84 has a radius of curvature ranging from about 500 millimeters to about 3,000 millimeters. Suitable materials for lid 82 include copper, aluminum, aluminum silicon carbide, or the like. Lid 82 protects semiconductor chip 66 from physical and environmental stresses. Semiconductor component 50 having lid 82 mounted to PGA substrate 52 is also referred to as a circuit module. It should be understood that for the sake of clarity, semiconductor component 50 has been drawn in exaggerated form to show the curvature of the semiconductor chip 66 and mating portion 84.

Semiconductor component 50 is placed in a clamp fixture (not shown) and a force that may be a uniform pressure is applied to external surface 86 of lid 82. The force causes thermal interface material 78 to move laterally between back surface 70 and lid 82. The assembly comprising semiconductor component 50 is placed in a curing oven (not shown) to cure lid adhesive material 80. After curing, semiconductor component 50 is removed from the oven, the clamp is removed and the semiconductor component is ready for use. Prior to use, semiconductor component 50 may undergo additional testing.

By now it should be appreciated that a semiconductor component having a lid with a radius of curvature corresponding to that of a semiconductor chip mounted to a support substrate and a method for manufacturing the semiconductor component have been provided. In accordance with an embodiment of the present invention, the radius of curvature of a portion of the lid is concave and the radius of curvature of the semiconductor chip is convex. In accordance with another embodiment, the mating surfaces of the lid and the semiconductor chip are flat. Preferably, the radius of curvature of the portion of the lid that mates with the semiconductor chip and the radius of curvature of the semiconductor chip match to within twenty percent of each other. Matching the radii of curvature of the lid to the semiconductor chip allows a greater and more uniform pressure to be applied to the thermal interface material, which increases its wetting. This lowers the thermal resistance at the interface between the lid and the semiconductor chip, which results in a greater amount of heat being removed from the semiconductor chip. This also lowers the junction-to-case temperature which improves the speed of the semiconductor chip.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising:
   providing a support substrate having a major surface;
   providing a semiconductor chip having first and second surfaces, the first surface opposite the second surface and having a first radius of curvature;
   coupling the second surface of the semiconductor chip to the major surface of the support substrate; and
   coupling a lid to the support substrate, wherein a portion of the lid is a chip mating surface which has a second radius of curvature and wherein the first radius of curvature matches the second radius of curvature and wherein the lid has an external surface opposite the chip mating surface.

2. The method of claim 1, wherein coupling the lid to the support substrate comprises forming a thermally conductive material on the first surface of the semiconductor chip.

3. The method of claim 2, wherein the thermally conductive material includes a low melting metal filler or a low melting alloy filler.

4. The method of claim 2, wherein coupling the lid to the support substrate further comprises coupling the chip mating surface to the first surface of the semiconductor chip through the thermally conductive material.

5. The method of claim 4, wherein coupling the lid to the support substrate further comprises applying a uniform pressure against the external surface.

6. The method of claim 5, wherein the support substrate comprises one of a ceramic material or an organic material.

7. The method of claim 6, wherein the first radius of curvature is within twenty percent of the second radius of curvature.

8. The method of claim 1, wherein coupling the lid to the support substrate comprises:
   providing a lid having a lip and the chip-mating surface;
   coupling the lip to the support substrate; and
   coupling the chip-mating surface to the first surface of the semiconductor chip.

9. The method of claim 8, wherein coupling the chip mating surface to the first surface of the semiconductor chip includes forming a thermal interface material on the first surface of the semiconductor chip.

10. A method for manufacturing a semiconductor component, comprising:
    providing a support substrate having a semiconductor die mounted thereto, wherein the semiconductor die has a die surface which has a first radius of curvature; and
    coupling a lid having a lip and first and second surfaces to the support substrate, wherein a portion of the first surface has a second radius of curvature, and wherein coupling the lid to the support substrate includes selecting the lid so the second radius of curvature matches the first radius of curvature.

11. The method of claim 10, wherein the first and second radii of curvature are within twenty percent of each other.

12. The method of claim 10, wherein coupling the lid to the support substrate includes forming a thermal interface material between the semiconductor die surface and the portion of the first surface of the lid having the second radius of curvature.

13. The method of claim 12, wherein coupling the lid to the support substrate includes wetting the thermal interface material.

14. The method of claim 13, wherein forming the thermal interface material includes using a thermal interface material having a low melting metal alloy filler.

15. The method of claim 10, wherein providing the support substrate includes using a support substrate comprising one of an organic material or a ceramic material.

16. The method of claim 10, wherein coupling the lid to the support substrate includes generating a substantially uniform pressure at an interface between the die surface and the portion of the first surface of the lid having the second radius of curvature.

17. The method of claim 10, wherein coupling the lid includes using a lid comprising a material selected from the group of materials consisting of aluminum, aluminum silicon carbide, and copper.

18. A semiconductor component, comprising:
    a support substrate having a surface, the surface having a radius of curvature;
    a semiconductor chip having first and second surfaces, the first surface having a radius of curvature; and
    a lid having a lip and a mating surface, wherein the mating surface of the lid has a radius of curvature that corresponds to the radius of curvature of the first surface, and wherein the mating surface of the lid is adjacent the first surface of the semiconductor chip.

19. The semiconductor component of claim 18, further including a thermal interface material between the surface of the support substrate and the mating surface of the lid.

20. The semiconductor component of claim 18, wherein the radius of curvature of the support substrate surface is within twenty percent of the radius of curvature of the mating surface of the lid.

* * * * *